(12) United States Patent
Park et al.

(10) Patent No.: US 11,683,989 B2
(45) Date of Patent: Jun. 20, 2023

(54) DATA STORAGE DEVICES AND METHODS FOR MANUFACTURING THE SAME

(71) Applicant: Samsung Electronics Co., Ltd., Suwon-si (KR)

(72) Inventors: Jongchul Park, Seongnam-si (KR); Sang-Kuk Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 138 days.

(21) Appl. No.: 17/169,759

(22) Filed: Feb. 8, 2021

(65) Prior Publication Data

US 2021/0167283 A1 Jun. 3, 2021

Related U.S. Application Data

(63) Continuation of application No. 16/837,424, filed on Apr. 1, 2020, now Pat. No. 10,978,638, which is a continuation of application No. 16/110,483, filed on Aug. 23, 2018, now abandoned, which is a
(Continued)

(30) Foreign Application Priority Data

Nov. 2, 2016 (KR) .......................... 10-2016-0145368

(51) Int. Cl.
| H10N 50/01 | (2023.01) |
| H10B 61/00 | (2023.01) |
| H10N 50/10 | (2023.01) |
| H10N 50/80 | (2023.01) |

(52) U.S. Cl.
CPC ............. *H10N 50/01* (2023.02); *H10B 61/00* (2023.02); *H10N 50/10* (2023.02); *H10N 50/80* (2023.02)

(58) Field of Classification Search
None
See application file for complete search history.

(56) References Cited

U.S. PATENT DOCUMENTS

| 7,544,983 | B2 | 6/2009 | Yang |
| 8,045,299 | B2 | 10/2011 | Fontana, Jr. et al. |
| 8,574,928 | B2 | 11/2013 | Satoh et al. |
| | | (Continued) | |

FOREIGN PATENT DOCUMENTS

| JP | 2010-186869 A | 8/2010 |
| JP | 2011-166157 A | 8/2011 |
| | (Continued) | |

*Primary Examiner* — Jay C Chang
(74) *Attorney, Agent, or Firm* — Harness, Dickey & Pierce, P.L.C.

(57) ABSTRACT

A method of manufacturing a data storage device may include forming a magnetic tunnel junction layer on a substrate, irradiating a first ion beam on the magnetic tunnel junction layer to form magnetic tunnel junction patterns separated from each other, irradiating a second ion beam on the magnetic tunnel junction layer, and irradiating a third ion beam on the magnetic tunnel junction layer. The first ion beam may be irradiated at a first incident angle. The second ion beam may be irradiated at a second incident angle that may be smaller than the first incident angle. The third ion beam may be irradiated to form sidewall insulating patterns on sidewalls of the magnetic tunnel junction patterns based on re-depositing materials separated by the third ion beam on the sidewalls of the magnetic tunnel junction patterns.

19 Claims, 13 Drawing Sheets

Related U.S. Application Data continuation of application No. 15/606,136, filed on May 26, 2017, now Pat. No. 10,115,893.

(56) References Cited

U.S. PATENT DOCUMENTS

| | | | |
|---|---|---|---|
| 8,590,139 | B2 | 11/2013 | Op De Beeck et al. |
| 8,772,888 | B2 | 7/2014 | Jung et al. |
| 8,828,742 | B2 | 9/2014 | Iba |
| 8,987,007 | B2 | 3/2015 | Tomioka |
| 9,087,981 | B2 | 7/2015 | Hsu et al. |
| 9,269,892 | B2 | 2/2016 | Fujita et al. |
| 2004/0188732 | A1* | 9/2004 | Fukuzumi ............... H01L 43/12 257/E27.005 |
| 2012/0299133 | A1* | 11/2012 | Son .................. H01L 43/08 257/E29.323 |
| 2014/0170778 | A1 | 6/2014 | Ikeda |
| 2015/0069554 | A1* | 3/2015 | Nakayama ............. H01L 43/02 257/421 |
| 2016/0035969 | A1 | 2/2016 | Kang et al. |
| 2016/0043306 | A1 | 2/2016 | Huang et al. |
| 2016/0072055 | A1 | 3/2016 | Seto et al. |
| 2016/0087195 | A1 | 3/2016 | Sonoda |
| 2016/0155934 | A1 | 6/2016 | Hwang et al. |
| 2017/0256705 | A1 | 9/2017 | Yoshikawa et al. |
| 2017/0358739 | A1 | 12/2017 | Kim et al. |

FOREIGN PATENT DOCUMENTS

| | | |
|---|---|---|
| JP | 2016-018964 A | 2/2016 |
| KR | 2014-0038193 A | 3/2014 |
| KR | 10-2015-0026828 A | 3/2015 |

\* cited by examiner

DATA STORAGE DEVICES AND METHODS FOR MANUFACTURING THE SAME

CROSS-REFERENCE TO RELATED APPLICATIONS

This application is a continuation of U.S. application Ser. No. 16/837,424, filed on Apr. 1, 2020, which is a continuation of U.S. application Ser. No. 16/110,483, filed on Aug. 23, 2018, which is a continuation of U.S. application Ser. No. 15/606,136 filed on May 26, 2017, and now issued U.S. Pat. No. 10,115,893, which claims priority under 35 U.S.C. § 119 to Korean Patent Application No. 10-2016-0145368, filed on Nov. 2, 2016, in the Korean Intellectual Property Office, the disclosure of each of which is hereby incorporated by reference in its entirety.

BACKGROUND

1. Technical Field

Example embodiments of the inventive concepts relate to semiconductor devices and methods for manufacturing the same, more particularly, to data storage devices and methods for manufacturing the same.

2. Description of Related Art

A spin-transfer torque MTJ (Magnetic Tunnel Junction) element has a stacked structure where a nonmagnetic barrier layer (an insulating film) is sandwiched between two ferromagnetic layers, and stores data by a change in a magnetic resistance caused by spin-polarized tunneling. The MTJ element can be switched into a low resistance state or a high resistance state depending on the magnetization directions of the two ferromagnetic layers. The MTJ element is in a low resistance when the magnetization directions (spin directions) of the two ferromagnetic layers are in a parallel state, and in a high resistance state when the magnetization directions (spin directions) thereof are in an anti-parallel state.

SUMMARY

According to some example embodiments, a method for manufacturing a data storage device may include: forming a magnetic tunnel junction layer on a substrate; irradiating a first ion beam on the magnetic tunnel junction layer at a first incident angle with respect to a top surface of the substrate and in situ in a first chamber to form a plurality of magnetic tunnel junction patterns at the magnetic tunnel junction layer, the plurality of magnetic tunnel junction patterns separated from each other; irradiating a second ion beam on the magnetic tunnel junction layer at a second incident angle with respect to the top surface of the substrate and in situ in the first chamber, subsequently to irradiating the first ion beam on the magnetic tunnel junction layer, the second incident angle smaller than the first incident angle; and irradiating a third ion beam on the magnetic tunnel junction layer at a third incident angle with respect to the top surface of the substrate and in situ in the first chamber, subsequently to irradiating the second ion beam on the magnetic tunnel junction layer, the third incident angle greater than the first incident angle.

According to some example embodiments, a data storage device may include: an interlayer insulating layer on a substrate; a plurality of contact plugs in the interlayer insulating layer; a plurality of magnetic tunnel junction patterns on the contact plugs; a plurality of sidewall insulating patterns on sidewalls of the magnetic tunnel junction patterns; and a capping dielectric layer on the plurality of sidewall insulating patterns, Each magnetic tunnel junction pattern of the plurality of magnetic tunnel junction patterns includes a first magnetic pattern on the substrate, a tunnel barrier pattern on the first magnetic pattern, and a second magnetic pattern on the tunnel barrier pattern. The tunnel barrier pattern may have a thickness varying in direct proportion with proximity to the capping dielectric layer.

According to some example embodiments, a method for manufacturing a data storage device may include: forming an interlayer insulating layer on a substrate; forming a magnetic tunnel junction layer on the substrate; irradiating a first ion beam on the magnetic tunnel junction layer to form a plurality of magnetic tunnel junction patterns based on etching the magnetic tunnel junction layer, the plurality of magnetic tunnel junction patterns separated from each other; irradiating a second ion beam on the magnetic tunnel junction layer to remove etch residues from sidewalls of the magnetic tunnel junction patterns; and irradiating a third ion beam on the magnetic tunnel junction layer to form sidewall insulating patterns on sidewalls of the magnetic tunnel junction patterns based on re-depositing materials separated from the interlayer insulating layer by the third ion beam on the sidewalls of the magnetic tunnel junction patterns.

According to some example embodiments, a method for manufacturing a data storage device may include: forming an interlayer insulating layer on a substrate; forming a magnetic tunnel junction layer on the substrate; irradiating a first ion beam on the magnetic tunnel junction layer to form a plurality of magnetic tunnel junction patterns based on etching the magnetic tunnel junction layer, the plurality of magnetic tunnel junction patterns separated from each other; and irradiating a second ion beam on the magnetic tunnel junction layer to form sidewall insulating patterns on sidewalls of the magnetic tunnel junction patterns based on re-depositing materials separated from the interlayer insulating layer by the second ion beam on the sidewalls of the magnetic tunnel junction patterns.

BRIEF DESCRIPTION OF THE DRAWINGS

Example embodiments will become more apparent in view of the attached drawings and accompanying detailed description.

DETAILED DESCRIPTION OF THE EMBODIMENTS

Hereinafter, example embodiments of the inventive concepts will be fully described with reference to the accompanying drawings.

Figure 1:
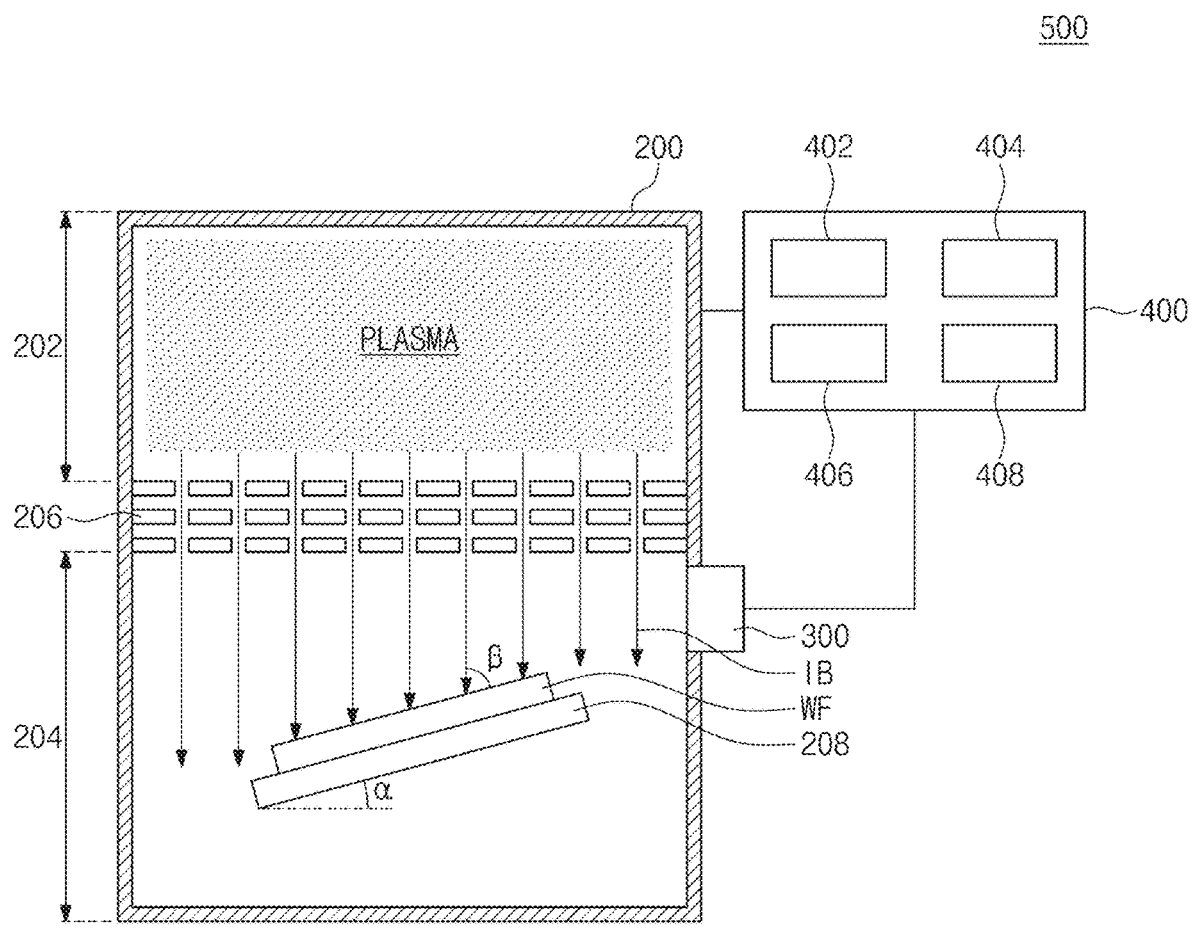
FIG. 1 is a schematic diagram illustrating an ion beam apparatus according to some example embodiments of the inventive concepts.

FIG. 1 is a schematic diagram illustrating an ion beam apparatus according to some example embodiments of the inventive concepts. Referring to FIG. 1, an ion beam apparatus 500 may include a chamber assembly 200 in which a process is performed using an ion beam IB, a detector 300 combined with the chamber assembly 200, and a computer system 400 connected to the chamber assembly 200 and the detector 300.

In some example embodiments, a process performed using an ion beam IB may include an ion beam etching process, also referred to herein as etching of a material based on directing an ion beam IB on the material, also referred to herein as ion beam IB etching. Ion beam IB etching may include etching the material to form a pattern. The pattern may include an MTJ pattern.

Ion beam IB etching may include directing an ion beam IB into a portion of the chamber assembly 200, also referred to as irradiating at least a portion of the chamber assembly 200 with the ion beam IB, such that the ion beam IB is directed on a material held within the portion of the chamber assembly 200. The ion beam IB direct on the material held within the portion of the chamber assembly 200 may etch at least a portion of the material. Thus, in some example embodiments, an ion beam apparatus 500 may be configured to execute ion beam etching with regard to a material held within the chamber assembly 200, including executing ion beam etching of at least a portion of the material.

The chamber assembly 200 may include a source chamber 202 in which a plasma may be generated. In some example embodiments, the chamber assembly 200 is configured to generate an ion beam IB based on the generated plasma. The chamber assembly 200 may further include a process chamber 204. The chamber assembly 200 may be configured to perform a in which the process is performed using the ion beam IB generated from the plasma in the source chamber 202, including ion beam IB etching of a material held within the process chamber 204. The source chamber 202 and the process chamber 204 may be communicated with each other. The chamber assembly 200 may include a grid 206 therein, and the grid 206 may be between the source chamber 202 and the process chamber 204. The grid 206 may be configured to control the ion beam IB, such that the grid 206 causes the ion beam IB to be irradiated into the process chamber 204. A stage 208 on which a wafer WF may be loaded may be included in the process chamber 204. Thus, the stage 208 may be configured to support a material, including wafer WF, in the process chamber 204.

As shown in FIG. 1, the stage 208 may be configured to be inclined ("tilted") with respect to a bottom surface of the chamber assembly 200. The stage 208 is configured to have a tilt angle α with respect to the bottom surface of the chamber assembly 200, so the ion beam IB may be irradiated to the wafer WF at a particular (or, alternatively, predetermined) incident angle β with respect to a top surface of the wafer WF where the incident angle β is a difference between 90 degrees and the tilt angle α. For example, a chuck capable of tilting (e.g., configured to tilt) in a desired direction may be disposed at a lower portion of the stage 208 to adjust the tilt angle α.

The incident angle β may be defined by (e.g., may be based on) an angle at which the ion beam IB is irradiated with respect to an upper surface of the wafer WF, also referred to as the ion beam IB being directed on the top surface of the wafer WF. In addition, the incident angle β of the ion beam IB may be determined by the tilt angle α of the stage 208. In this specification, the incident angle and the tilt angle may be referred to as an angle of 90 degrees or less. The ion beam IB may be irradiated to the upper surface of the wafer WF to perform a particular (or, alternatively, predetermined) process on the wafer WF, including an ion beam IB etching of at least a portion of the wafer WF. The process may be performed to form semiconductor devices on the wafer WF. For example, the process may be an etch process by which a thin film formed on the wafer WF is etched.

Figure 16:
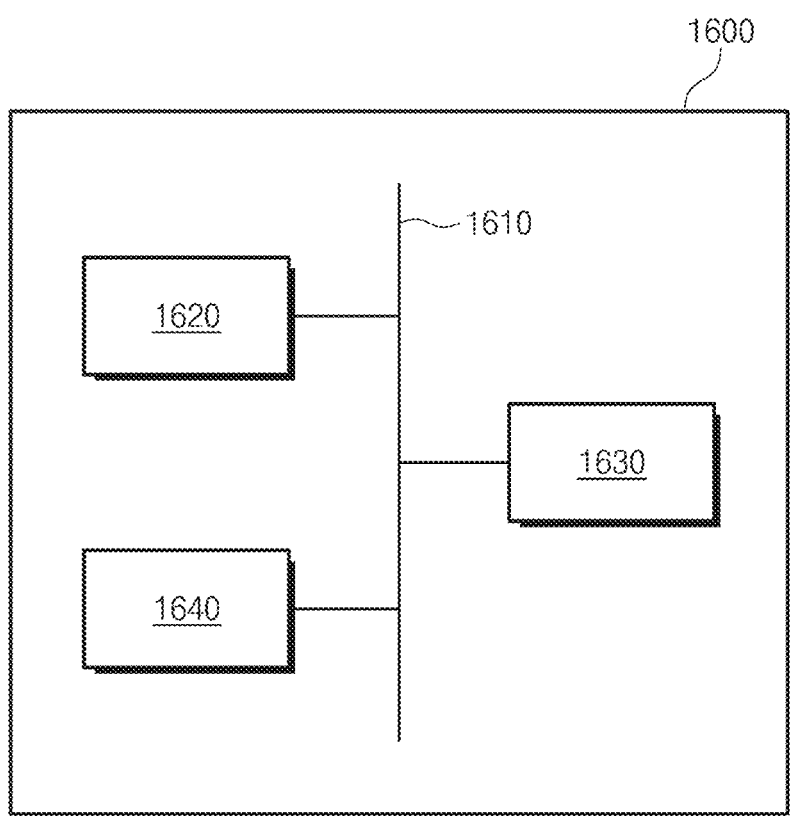
FIG. 16 is a diagram illustrating an electronic device 1600 according to some example embodiments.

The detector 300 may be configured to detect signals that are generated from a material in the chamber assembly 200 during the process. Such a material may include a material formed on the wafer WF, the wafer WF itself, some combination thereof, or the like. The signal may be generated by the material based on an ion beam IB being directed on the material. The computer system 400 may include a controller 402 (also referred to herein as a "processor") configured to control parameters of the chamber assembly 200 using the signals obtained from the detector 300, a library 404 (also referred to herein as a "memory") configured to store various data, an input/output unit 406 and an interface unit 408. The controller 402 ("processor") may include a hardware processor such as central processing unit (CPU), a multi-processor, a distributed processing system, an application specific integrated circuit (ASIC), and/or a suitable hardware processing unit, that when, executing instructions stored in the library 404 ("memory"), configures the controller 402 as a special purpose computer to perform the operations of one or more portions of the ion beam apparatus 500. The library 404 may include a hard disk and/or a non-volatile semiconductor memory device (e.g., a flash memory device, a phase-change memory device, and/or a magnetic memory device). The controller 402 may be configured to execute data stored at the library 404 to perform one or more operations. The controller 402 may vary at least one of an ion energy, an ion current and the incident angle β of the ion beam IB while the process is performed in the process chamber 204. Referring to FIG. 16, the controller 402 may be at least partially implemented by the electronic device 1600 illustrated in FIG. 16.

Figure 2:
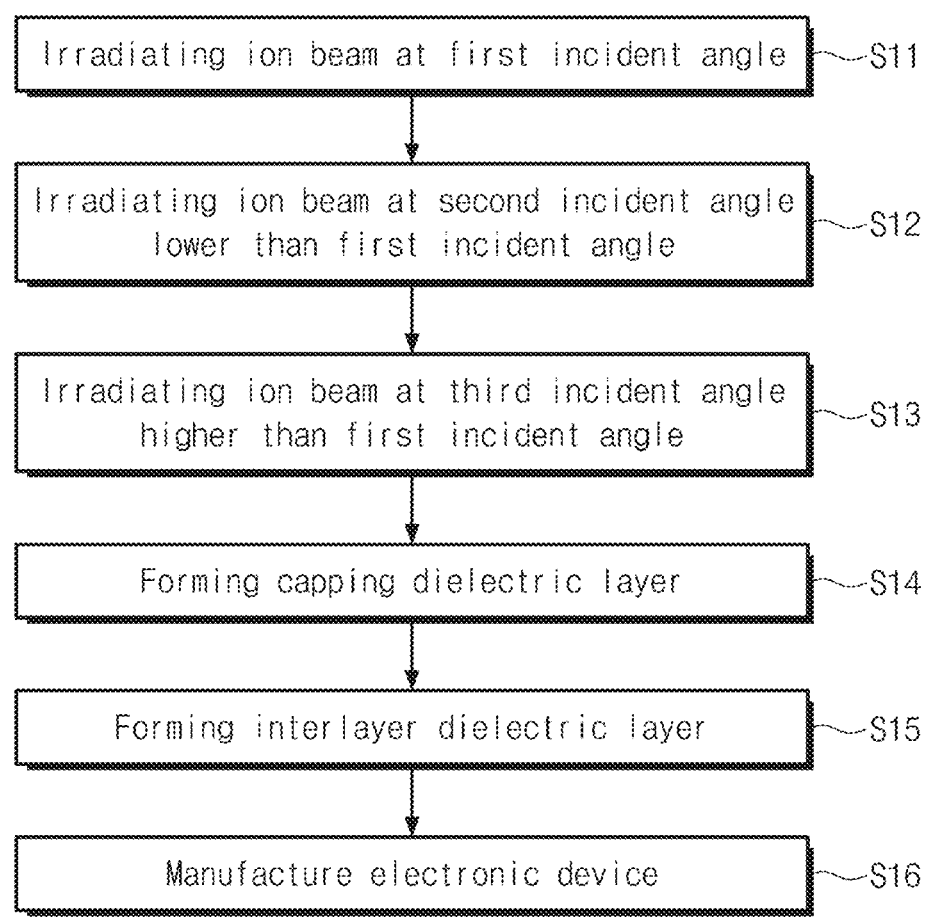
FIG. 2 is a process flow chart illustrating a method for manufacturing a data storage device according to some example embodiments of the inventive concepts.
Figure 3:
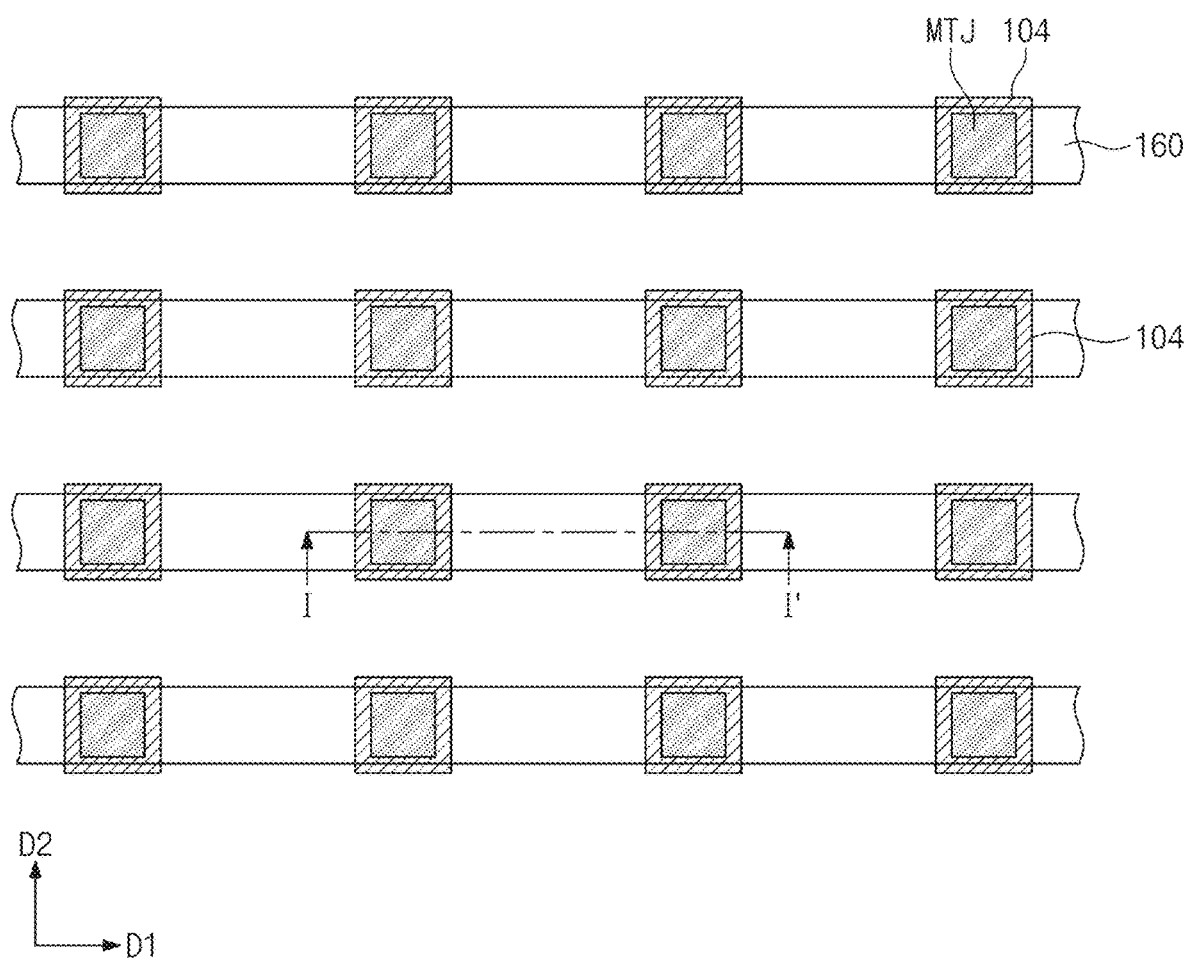
FIG. 3 is a plan view illustrating a data storage device according to some example embodiments of the inventive concepts.

FIG. 2 is a process flow chart illustrating a method for manufacturing a data storage device according to some example embodiments of the inventive concepts. FIG. 3 is a plan view illustrating a data storage device according to some example embodiments of the inventive concepts. FIG. 4, FIG. 5, FIG. 6, FIG. 7, FIG. 8, and FIG. 9 are views illustrating a method for manufacturing a data storage device according to some example embodiments of the inventive concepts, and are cross-sectional views taken along line I-I' in FIG. 3. In some example embodiments, as described herein, a data storage device may include a magnetic memory device (e.g., an MRAM). In some example embodiments, the methods described herein may be at least partially implemented and/or controlled by the controller 402 illustrated and described with reference to FIG. 1.

Figure 4:
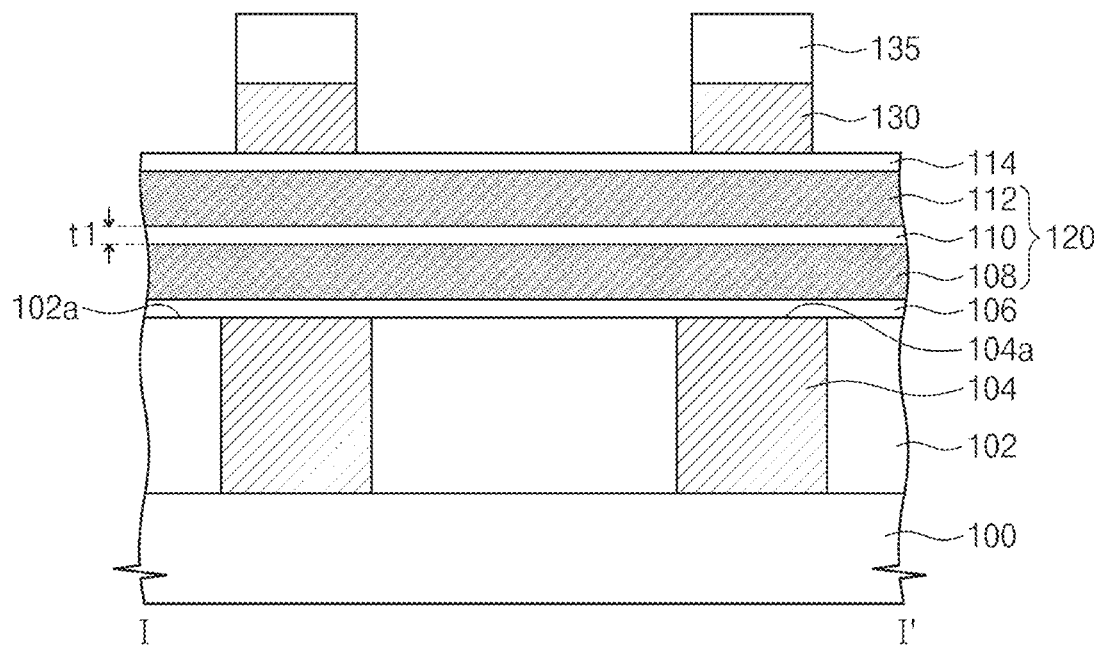
FIG. 4, FIG. 5, FIG. 6, FIG. 7, FIG. 8, and FIG. 9 are views illustrating a method for manufacturing a data storage device according to some example embodiments of the inventive concepts, and are cross-sectional views taken along line I-I' in FIG. 3.

Referring to FIGS. 3 and 4, a first interlayer insulating layer 102 may be provided (e.g., formed) on a substrate 100. The substrate 100 may include silicon (Si), silicon on insulator (SOI), silicon germanium (SiGe), germanium (Ge) and gallium arsenic (GaAs). Selection elements (not shown) may be provided on the substrate 100, and the first interlayer insulating layer 102 may cover the selection elements. The selection elements may include field effect transistors or diodes. The first interlayer insulating layer 102 may include oxide, nitride, carbide and/or oxynitride. For example, the first interlayer insulating layer 102 may include at least one of silicon oxide, silicon nitride, silicon carbide and aluminum oxide.

Contact plugs 104 may be in the first interlayer insulating layer 102. In some example embodiments, the interlayer insulating layer 102 surrounds the contact plugs 104. Each of the contact plugs 104 may penetrate (e.g., extend through) the first interlayer insulating layer 102 such that the contact plugs 104 are electrically connected to one terminal of a corresponding one of the selection elements. The contact plug 104 may include at least one of a doped semiconductor material (e.g., doped silicon), a metal (e.g., tungsten, titanium and/or tantalum), a conducive metal nitride (e.g., titanium nitride, tantalum nitride and/or tungsten nitride), and a metal-semiconductor compound (e.g., metal silicide). In some example embodiments, upper surfaces 104a of the contact plugs 104 may be substantially coplanar with an upper surface 102a of the first interlayer insulating layer 102.

As shown in at least FIG. 4, a lower conductive layer 106, a magnetic tunnel junction layer 120 and an upper conductive layer 114 may be sequentially stacked on the first interlayer insulating layer 102, such that the lower conductive layer 106 is on the first interlayer insulating layer 102, the magnetic tunnel junction layer 120 is on the lower conductive layer 106, and the upper conductive layer 114 is on the magnetic tunnel junction layer 120. The lower conductive layer 106 and the upper conductive layer 114 may include a conductive metal nitride, such as titanium nitride and/or tantalum nitride. The lower conductive layer 106 may include a material (e.g., ruthenium (Ru)) that contributes to crystal growth of magnetic layers constituting the magnetic tunnel junction layer 120. The lower conductive layer 106 may be formed by a sputtering process, a chemical vapor deposition (CVD) process or an atomic layer deposition (ALD) process. The magnetic tunnel junction layer 120 may include a first magnetic layer 108, a tunnel barrier layer 110 and a second magnetic layer 112 which are sequentially stacked on the lower conductive layer 106, such that the first magnetic layer 108 is on the lower conductive layer 106, the tunnel barrier layer 110 is on the first magnetic layer 108, and the second magnetic layer 112 is on the tunnel barrier layer 110. One magnetic layer of the first and second magnetic layers 108 and 112 may correspond to a reference layer that has a magnetic direction fixed in one direction, and the other magnetic layer of the first and second magnetic layers 108 and 112 may correspond to a free layer that has a magnetic direction changeable to be parallel or antiparallel to the fixed magnetic direction of the reference layer.

It will be understood that when an element, including a layer, film, region, or substrate is referred to as being "on" another element, it can be directly on the other element or intervening elements may also be present. In contrast, when an element is referred to as being "directly on" another element, there are no intervening elements present.

In some example embodiments, the magnetic directions of the reference layer and the free layer may be substantially perpendicular to an interface between the tunnel barrier layer 110 and the second magnetic layer 112. In some example embodiments, the magnetic directions of the reference layer and the free layer may be substantially parallel to an interface between the tunnel barrier layer 110 and the second magnetic layer 112. Hereinafter, the magnetic directions of the reference layer and the free layer will be described in more detail with reference to FIGS. 13 and 14.

The tunnel barrier layer 110 may include at least one of a magnesium oxide (MgO) layer, a titanium oxide (TiO) layer, an aluminum oxide (AlO) layer, a magnesium zinc oxide (MgZnO) layer or a magnesium boron oxide (MgBO) layer. Each of the first magnetic layer 108, the tunnel barrier layer 110 and the second magnetic layer 112 may be formed by a sputtering process, a physical vapor deposition (PVD) process or a CVD process. The tunnel barrier layer 110 may be deposited with a first thickness t1.

Mask patterns may be formed on the magnetic tunnel junction layer 120. The mask patterns may include conductive mask patterns 130 and insulating mask patterns 135, and the insulating mask patterns 135 may be disposed on the conductive mask patterns 130. The mask patterns may define regions in which pattern structures to be described later will be formed. The conductive mask patterns 130 may include at least one of tungsten, titanium, tantalum, aluminum, or metal nitrides (e.g., titanium nitride and tantalum nitride). The insulating mask patterns 135 may include at least one of silicon oxide, silicon nitride and silicon oxynitride.

Figure 5:
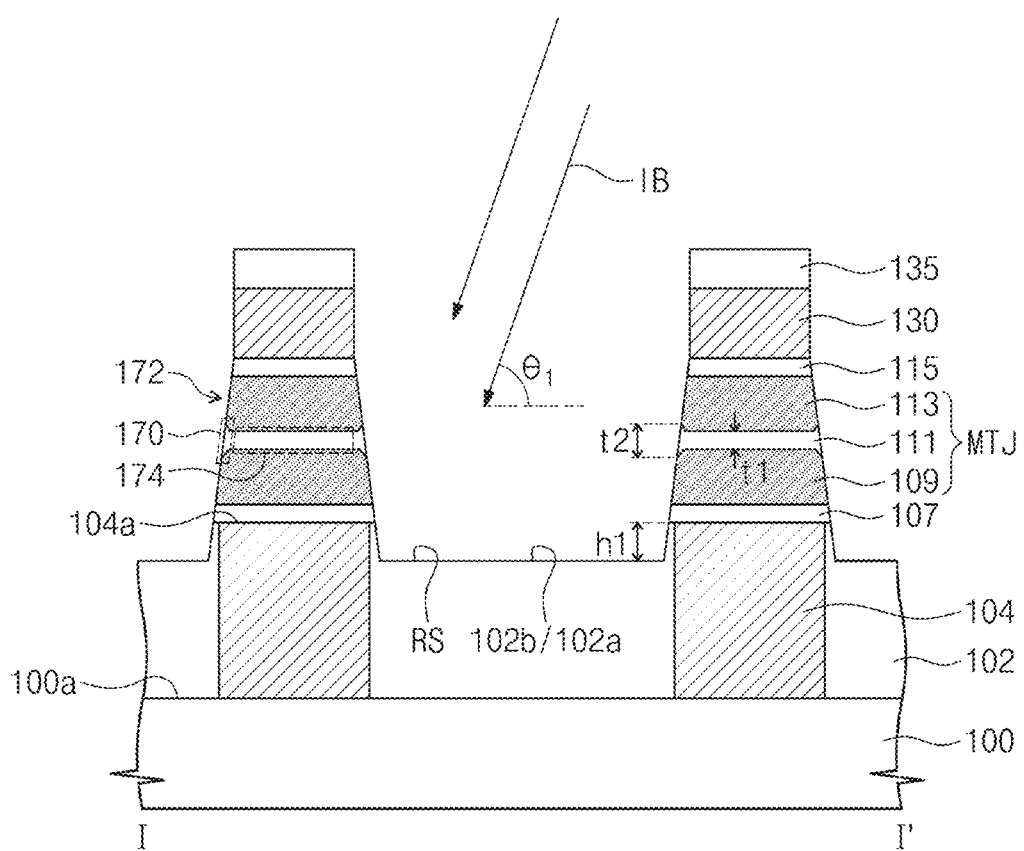

Referring to FIGS. 2, 3 and 5, an ion beam IB may be irradiated to the magnetic tunnel junction layer 120 formed on the substrate 100 at a first incident angle $\theta_1$ in relation to an upper surface 100a of the substrate 100 to form magnetic tunnel junction patterns MTJ separated from each other (S11, hereinafter, referred to as a first step). The magnetic tunnel junction patterns MTJ may be separated in a first direction D1 and in a second direction D2 through a single patterning process. Alternatively, a first patterning process for separating the magnetic tunnel junction layer in the first direction D1 and a second patterning process for separating the magnetic tunnel junction layer in the second direction D2 may be sequentially performed. The magnetic tunnel junction layer 120 may be etched using the mask patterns 130 and 135 as an etch mask. The first step S11 may be performed in the chamber assembly 200 of the ion beam apparatus 500 (e.g., in situ in the chamber assembly 200) described with reference to FIG. 1. In some example embodiments, the first step S11 may be performed using the ion beam including argon ions (Ar+). The first incident angle $\theta_1$ in relation to the upper surface 102a may be determined by the tilt angle of the stage 208 described with reference to FIG. 1. For example, the first incident angle $\theta_1$ may be in the range from about 50 degrees to about 80 degrees. As referred to herein, the ion beam IB that is irradiated to the substrate at the first incident angle $\theta_1$ may be referred to as a first ion beam IB.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure.

Each of the magnetic tunnel junction patterns MTJ may include a first magnetic pattern 109, a tunnel barrier pattern 111 and a second magnetic pattern 113 which are sequentially stacked on the substrate 100. The lower conductive layer 106 and the upper conductive layer 114 may correspond to lower conductive patterns 107 and upper conductive patterns 115, respectively. Upper portions of the insulating mask patterns 135 may be consumed according to the progress of the first step S11. In the first step S11, the first interlayer insulating layer 102 between the magnetic tunnel junction patterns MTJ may be exposed, and an upper portion thereof may be removed to form a recess region RS. In some example embodiments, after a completion of the first step S11, a level ("height") of a bottom surface 102b of the recess region RS may be lower than a level of an upper surface 104a of the contact plug 104 by a first depth h1.

During the first step S11, edge portions 170 of the tunnel barrier patterns 111 adjacent to the sidewalls 172 of the magnetic tunnel junction patterns MTJ may be thicker than the first thickness t1 described with reference to FIG. 4. That is, a thickness of a central portion 174 of the tunnel barrier pattern 111 between both sidewalls 172 of the magnetic tunnel junction pattern MTJ may be maintained at the first thickness t1, and a thickness of the edge portion 170 of the tunnel barrier pattern 111 may be a second thickness t2 that is greater than the first thickness t1. For example, the thickness of the tunnel barrier pattern 111 may be gradually increased from the central portion 174 to the edge portion 170. A variation of the thickness of the tunnel barrier pattern 111 may result from oxidation of a portion of the first and second magnetic patterns 109 and 113 which are adjacent to the tunnel barrier pattern 111 and exposed on the sidewalls 172 of the magnetic tunnel junction pattern MTJ. When the first interlayer insulating layer 102 is a material containing oxygen, such as silicon oxide, silicon oxynitride and aluminum oxide, oxygen atoms within the interlayer insulating layer 102 may be moved to the exposed sidewalls 172 of the tunnel barrier pattern 111 by the ion beam. Thus, a portion of the first and second magnetic patterns 109 and 113 may be oxidized by the oxygen atoms. When the first interlayer insulating layer 102 does not contain oxygen, the variation of the thickness of the tunnel barrier pattern 111 may not be generated. Hereinafter, example embodiments in which the thickness of the tunnel barrier pattern 111 is changed will be described, but the example embodiments are not limited thereto.

Figure 6:
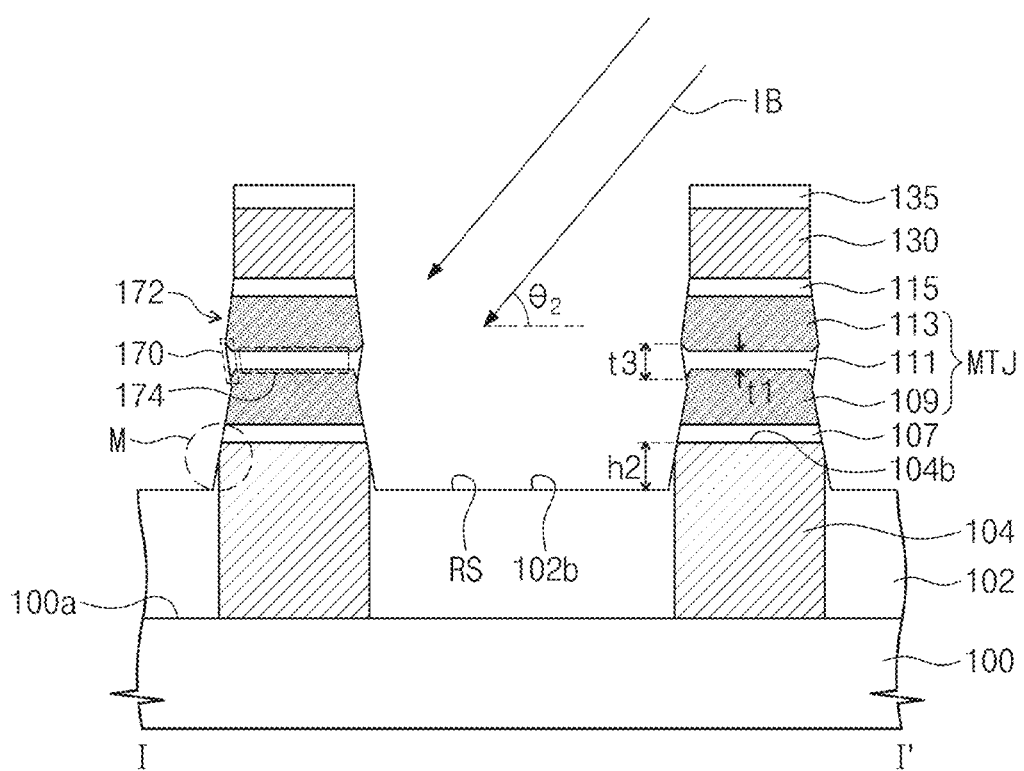

Referring to FIGS. 2, 3 and 6, an ion beam IB may be irradiated to the substrate 100 having the magnetic tunnel junction patterns MTJ thereon at a second incident angle $\theta_2$ (S12, hereinafter, referred to as a second step) in relation to the upper surface 100a of the substrate. The second incident angle $\theta_2$ may be smaller than the first incident angle $\theta_1$. In some example embodiments, the second incident angle $\theta_2$ may range from about 30 degrees to about 60 degrees. The second step S12 may be a process in which etch residues attached to the sidewalls 172 of the magnetic tunnel junction patterns MTJ in the first step S11 are removed. The etch residues may be easily removed from the sidewalls of the magnetic tunnel junction patterns MTJ by irradiating the ion beam with a relatively smaller incident angle than the incident angle of the ion beam used in the first step S11. The first and second steps S11 and S12 may be performed in situ in the same chamber assembly 200. Hereinafter, in this description, "in situ" processing refers to performing sequential processing in the same chamber assembly, with no vacuum break. As referred to herein, the ion beam IB that is irradiated to the substrate at the second incident angle $\theta_2$ may be referred to as a second ion beam IB.

After completion of the second step S12, the recess region RS may have a bottom surface 102b which is lowered from the upper surface 104a of the contact plug 104 by a second depth h2. The second depth h2 may be greater than the first depth h1. As a result, as shown in M region, a portion of sidewalls 104b of the contact plug 104 may be exposed. In some example embodiments, the sidewalls of the contact plug 104 may be exposed in the first step S11, or a third step S13 to be described later.

The thickness of the edge portions 170 of the tunnel barrier pattern 111 may be a third thickness t3 that is greater than the second thickness t2. However, the central portion 174 of the tunnel barrier pattern 111 may be maintained at the first thickness t1. A portion of the sidewalls 172 of the magnetic tunnel junction pattern MTJ may be etched together with the etch residues in the second step S12. As a result, as shown in FIG. 6, the magnetic tunnel junction pattern MTJ may have a reduced width in a lower portion thereof. Although the insulating mask pattern 135 is further consumed during the second step S12, at least a portion of the insulating mask pattern 135 may remain on the conductive mask pattern 130 after completion of the second step S12.

Figure 7:
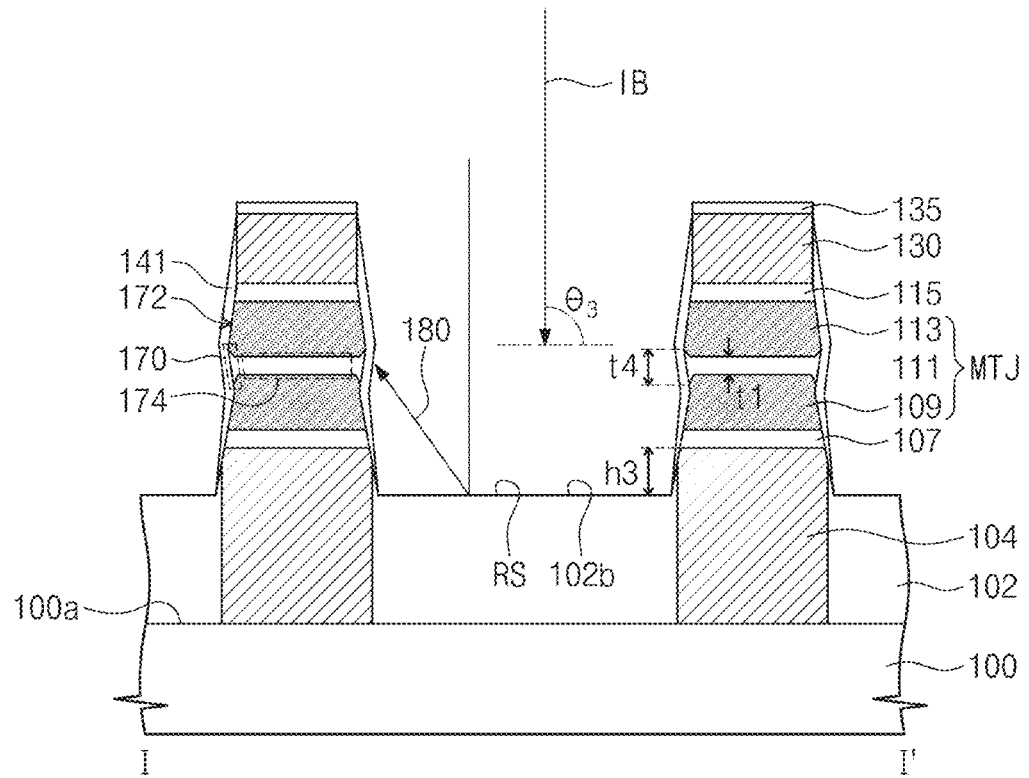

Referring to FIGS. 2, 3 and 7, an ion beam IB may be irradiated to the substrate 100 having the magnetic tunnel junction patterns MTJ thereon at a third incident angle $\theta_3$ (S13, hereinafter, referred to as a third step). As referred to herein, the ion beam IB that is irradiated to the substrate at the third incident angle $\theta_3$ may be referred to as a third ion beam IB. The third incident angle $\theta_3$ may be greater than the first incident angle $\theta_1$ in relation to upper surface 100a of the substrate. In some example embodiments, the third incident angle $\theta_3$ may range from about 70 degrees to about 90 degrees. The third step S13 may be continuously performed along with the first and second steps S11 and S12 in the same chamber assembly. That is, the first to third steps S11, S12 and S13 may be performed in situ.

In some example embodiments, step S12 as shown in FIGS. 2, 3, and 6 may be omitted, such that the third ion beam IB that is irradiated at the third incident angle $\theta_3$ may be referred to as a second ion beam IB that is irradiated at a second incident angle.

Since the ion beam in the third step S13 is irradiated at the relatively high incident angle with respect to the upper surface 100a of the substrate 100, the first interlayer insulating layer 102 may be more affected by the ion beam than the sidewalls 172 of the magnetic tunnel junction pattern MTJ. As a result, amount of materials to be separated from the first interlayer insulating layer 102 by the ion beam may be more than that in first step and second steps S11 and S12, and some of them may be re-deposited 180 on the sidewalls 172 of the magnetic tunnel junction pattern MTJ to form sidewall insulating patterns 141. The sidewall insulating patterns 141 may include the same materials as the first interlayer insulating layer 102. For example, the sidewall insulating patterns 141 may include at least one of silicon oxide, silicon nitride, silicon carbide and aluminum oxide.

When an ion incident energy in the third step S13 is greater than an ion incident energy in the first step S11, an excessive over-etch with respect to the magnetic tunnel junction pattern MTJ may be generated, and when the ion incident energy in the third step S13 is smaller than an ion incident energy in the second step S12, the sidewall insulating patterns 141 may be not formed. Thus, the ion incident energy in the third step S13 may be greater than the ion incident energy in the second step S12, and may be smaller than the ion incident energy in the first step S11. The ion incident energy in the first to third steps S11, S12 and S13 may be compared by measuring a voltage of the grid 206 described with reference to FIG. 1.

The insulating mask pattern 135 may be further consumed during the third step S13. After completion of the third step S13, the insulating mask pattern 135 may be completely consumed. Alternatively, even after the completion of the third step S13, a portion of the insulating mask pattern 135 may remain on the conductive mask pattern 130. After the completion of the third step S13, the bottom surface 102*b* of the recess region RS may be lowered from the upper surface of the contact plug 104 by a third depth h3 that is greater than the second depth h2. The thickness of the edge portion 170 of the tunnel barrier pattern 111 may be a fourth thickness t4 that is greater than the third thickness t3. However, the thickness of the central portion 174 of the tunnel barrier pattern 111 may be maintained at the first thickness t1. Accordingly, the tunnel barrier pattern 111 may have a thickness varying in direct proportion with proximity to the sidewalls 172.

Figure 8:
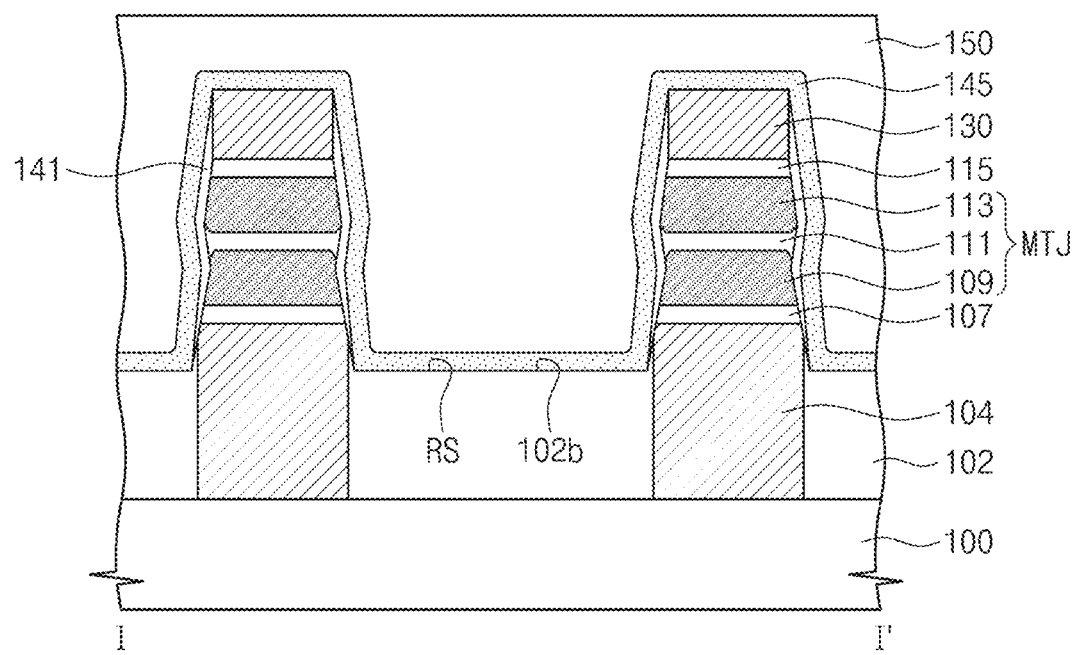

Referring to FIGS. 2, 3 and 8, a capping dielectric layer 145 may be formed on a resultant structure in which the sidewall insulating patterns 141 are formed (S14, a fourth step). A formation of the capping dielectric layer 145 may be performed in a different chamber assembly from the chamber assembly in which the first to third steps S11, S12 and S13 are performed. That is, after the completion of the third step S13, the wafer WF may be taken out of the chamber assembly 200 described with reference to FIG. 2 (e.g., a first chamber), and the capping dielectric layer 145 may be formed after being transferred to another chamber (e.g., a second chamber).

When the wafer is moved between chambers or equipment, external materials, such as oxygen, nitrogen or water ($H_2O$) may penetrate into the magnetic tunnel junction pattern MTJ, and thus, the data storage device may be deteriorated. According to some example embodiments of the inventive concepts, before moving the wafer WF to form the capping dielectric layer 145, the sidewall insulating patterns 141 may be formed to prevent such deterioration. As a result, the reliability and/or performance of MTJs that may be included in a manufactured data storage device may be improved by being protected from such deterioration. Thus, data storage devices having improved reliability and/or performance may be manufactured, thereby at least partially mitigating a problem of reduced data storage device performance and/or reliability as a result of magnetic tunnel junction pattern MTJ deterioration as a result of external materials penetrating in the magnetic tunnel junction pattern MTJ when the wafer WF is moved between chambers or equipment during manufacture of the data storage device.

A method of forming the sidewall insulating patterns 141 in the third step S13 may include oxidizing conductive residues attached to the sidewalls of the magnetic tunnel junction pattern MTJ in the previous step. Since the sidewall insulating patterns 141 are formed using the first interlayer insulating layer 102 located relatively below as source material, an amount of the material re-deposited on the mask patterns 130 and 135 may be small as compared with general deposition methods. As a result, a subsequent contact hole process or planarization process can proceed more efficiently. In addition, since the sidewall insulating patterns 141 are formed using an in situ process without an additional apparatus or supply of additional source material, the process can be simplified.

The capping dielectric layer 145 may be formed by a CVD process or a PVD process. In some example embodiments, the capping dielectric layer 145 may include silicon oxide, silicon nitride or silicon oxynitride. The capping dielectric layer 145 may be conformally formed on the magnetic tunnel junction patterns MTJ and the upper surface 102*a* of the first interlayer insulating layer 102 (the upper surface of the first interlayer insulating layer 102 including the bottom surface 102*b* of the recess region RS).

A second interlayer insulating layer 150 may be formed on the capping dielectric layer 145 (S15, a fifth step). The second interlayer insulating layer 150 may be formed to fill spaces between the magnetic tunnel junction patterns MTJ. For example, the second interlayer insulating layer 150 may include silicon oxide or silicon oxynitride.

Figure 9:
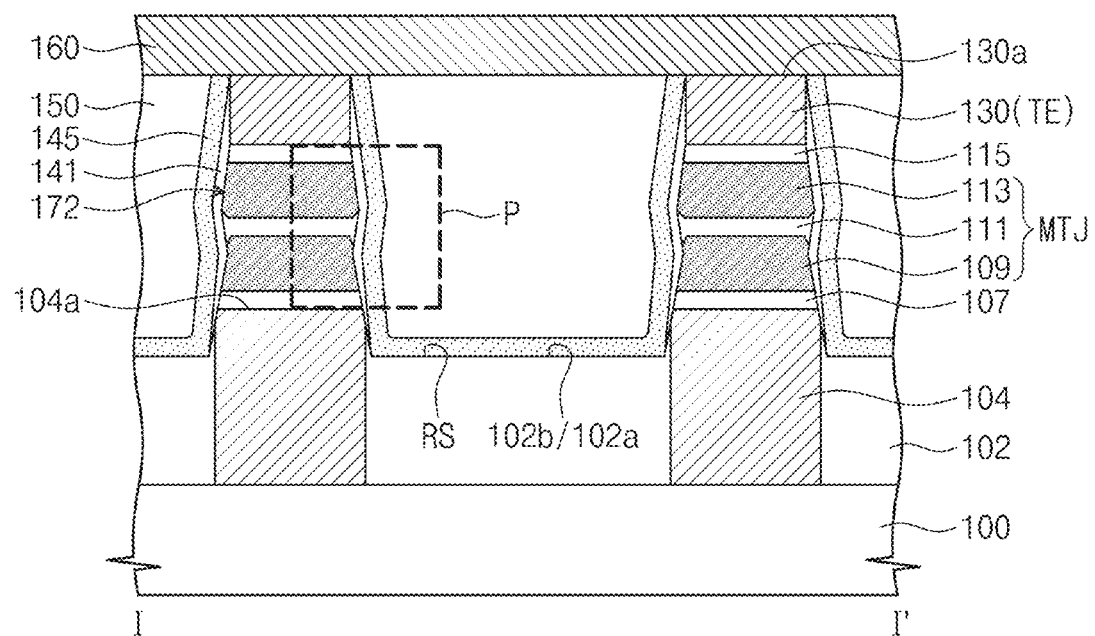

Referring to FIGS. 3 and 9, conductive lines 160 may be formed after performing a planarization process to expose upper surfaces 130*a* of the conductive mask patterns 130. The conductive mask pattern 130 may be configured to function as a top electrode TE. The conductive line 160 may include metal and/or conductive metal nitride.

Referring to FIGS. 2 and 16, in some example embodiments, an electronic device may be manufactured based on the manufactured data storage device (S16, a sixth step). In some example embodiments, where the electronic device (e.g., electronic device 1600 as shown in FIG. 16) includes a memory, the manufacture of the electronic device may include manufacturing a memory that incorporates a data storage device manufactured according to one or more example embodiments as described herein and further incorporating the memory into the manufactured electronic device.

Figure 10:
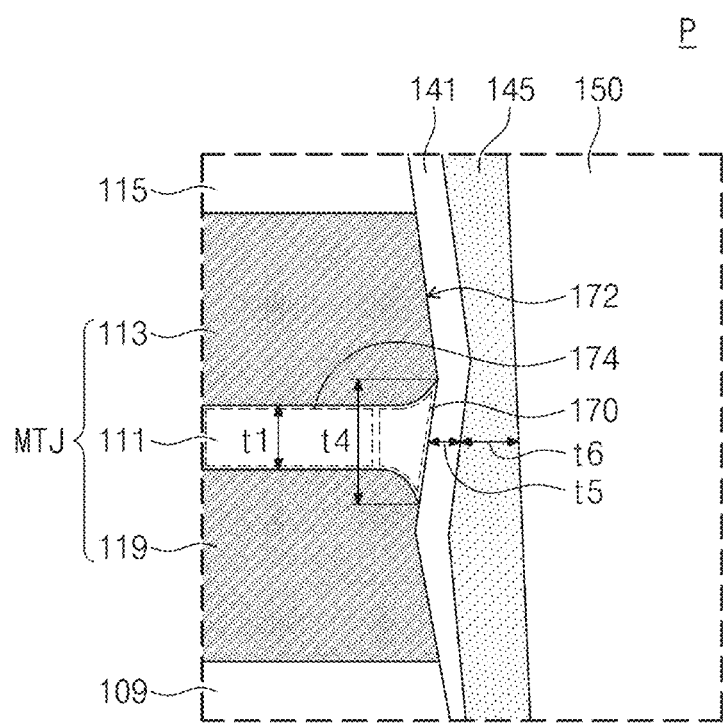
FIG. 10 is an enlarged view of a portion 'P' of FIG. 9.
Figure 13:
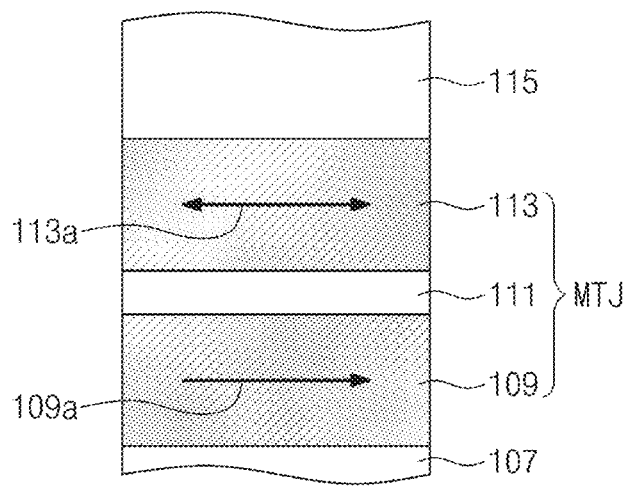
FIG. 13 is a view for explaining a magnetic tunnel junction pattern of FIG. 3.
Figure 14:
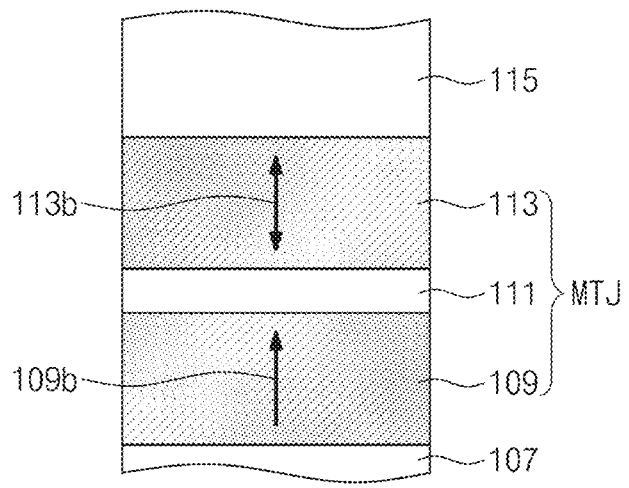
FIG. 14 is a view for explaining a magnetic tunnel junction pattern of FIG. 3.

FIG. 10 is an enlarged view of a portion 'P' of FIG. 9. FIG. 13 is a view for explaining an example of a magnetic tunnel junction pattern of FIG. 3. FIG. 14 is a view for explaining another example of a magnetic tunnel junction pattern of FIG. 3. Hereinafter, a data storage device according to some example embodiments of the inventive concepts will be described in more detail with reference to FIGS. 3, 9, 10, 13 and 14.

Referring to FIGS. 3, 9 and 10, the interlayer insulating layer 102 may be provided on the substrate 100. Select elements (not shown) may be provided on the substrate 100, and the interlayer insulating layer 102 may cover the select elements. The select elements may include field effect transistors or diodes. Contact plugs 104 may be provided in the first interlayer insulating layer 102. Each of the contact plugs 104 may penetrate the first interlayer insulating layer 102 so as to be electrically connected to one terminal of a corresponding one of the selection elements. In some example embodiments, a recess region RS may be provided on an upper portion of the first interlayer insulating layer 102, and a level of a bottom surface 102*b* of the recess region RS may be lower than a level of an upper surface 104*a* of the contact plug 104. The lower conductive pattern 107, the magnetic tunnel junction pattern MTJ and the upper conductive pattern 115 may be sequentially disposed on the contact plug 104. The upper conductive pattern 115 may be omitted.

The magnetic tunnel junction pattern MTJ may include the first magnetic pattern 109, the second magnetic pattern 113 and the tunnel barrier pattern 111 interposed therebetween. Sidewall insulating patterns 141 may be provided on the sidewalls 172 of the magnetic tunnel junction pattern MTJ. The sidewall insulating patterns 141 may include the same material as the first interlayer insulating layer 102. For example, the sidewall insulating pattern 141 may include at least one of silicon oxide, silicon nitride, silicon carbide and aluminum oxide. A capping dielectric layer 145 may be provided on the sidewall insulating patterns 141. For example, the capping dielectric layer 145 may include silicon oxide, silicon nitride or silicon oxynitride. The capping dielectric layer 145 may be conformally formed on the magnetic tunnel junction patterns MTJ and the upper surface 102a of the first interlayer insulating layer 102. A second interlayer insulating layer 150 may be formed on the capping dielectric layer 145.

A thickness of a central portion 174 of the tunnel barrier pattern 111 between both sidewalls 172 of the magnetic tunnel junction pattern MTJ may be the first thickness t1, and a thickness of the edge portion 170 of the tunnel barrier pattern may be a fourth thickness t4 that is greater than the first thickness t1. For example, the thickness of the tunnel barrier pattern 111 may be gradually increased toward the capping dielectric layer 145. Due to this shape of the tunnel barrier pattern 111, a leakage current of the data storage device may be reduced. Accordingly, the tunnel barrier pattern 111 may have a thickness varying in direct proportion with proximity to the capping dielectric layer 145.

At a portion adjacent to the tunnel barrier pattern 111, the sidewall insulating pattern 141 may have a fifth thickness t5 and the capping dielectric layer 145 may have a sixth thickness t6. The sixth thickness t6 may be greater than the fifth thickness t5.

In some example embodiments, referring to FIG. 13, magnetization directions 109a and 113a of the first and second magnetic patterns 109 and 113 may be substantially parallel to an interface between the tunnel barrier pattern 111 and the second magnetic pattern 113. In FIG. 13, the first magnetic pattern 109 may be a reference pattern, and the second magnetic pattern 113 may be a free pattern. However, the inventive concepts are not limited thereto. Alternatively, the first magnetic pattern 109 may be the free pattern, and the second magnetic pattern 113 may be the reference pattern. The first and second magnetic patterns 109 and 113 having the magnetic directions 109a and 113a, which are parallel to the interface between the tunnel barrier pattern 111 and the second magnetic pattern 113, may include ferromagnetic materials. The first magnetic pattern 109 corresponding to the reference pattern may further include an anti-ferromagnetic material used to fix a magnetization direction of the ferromagnetic material included in the first magnetic pattern 109.

In some example embodiments, referring to FIG. 14, magnetization directions 109b and 113b of the first and second magnetic patterns 109 and 113 may be substantially perpendicular to an interface between the tunnel barrier pattern 111 and the second magnetic pattern 113. In FIG. 14, the first magnetic pattern 109 may be a reference pattern, and the second magnetic pattern 113 may be a free pattern. However, the inventive concepts are not limited thereto. Alternatively, the first magnetic pattern 109 may be the free pattern, and the second magnetic pattern 113 may be the reference pattern. The first and second magnetic patterns 109 and 113 having the magnetic directions 109b and 113b, which are perpendicular to the interface between the tunnel barrier pattern 111 and the second magnetic pattern 113, may include at least one of a perpendicular magnetic material (e.g., CoFeTb, CoFeGd, or CoFeDy), a perpendicular magnetic material having a $L1_0$ structure, CoPt having a hexagonal closed packed lattice (HCP) crystal structure, or a perpendicular magnetic structure. The perpendicular magnetic material having a $L1_0$ structure may include at least one of FePt having the $L1_0$ structure, FePd having the $L1_0$ structure, CoPd having the $L1_0$ structure, or CoPt having the $L1_0$ structure. The perpendicular magnetic structure may include magnetic layers and non-magnetic layers which are alternately and repeatedly stacked. For example, the perpendicular magnetic structure may include at least one of $(Co/Pt)n$, $(CoFe/Pt)n$, $(CoFe/Pd)n$, $(Co/Pd)n$, $(Co/Ni)n$, $(CoNi/Pt)n$, $(CoCr/Pt)n$, or $(CoCr/Pd)n$, where "n" denotes the number of bilayers.

Referring back to FIGS. 3 and 9, conductive lines 160 may be provided on the second interlayer insulating layer 150. The conductive lines 160 may serve as bit lines. When viewed in a plan view, the conductive line 160 may extend in a first direction D1, and may be electrically connected to the magnetic tunnel junction patterns MTJ arranged along the first direction D1. Each of the magnetic tunnel junction patterns MTJ may be electrically connected to the conductive line 160 through the top electrode TE which is corresponding to each of the magnetic tunnel junction patterns MTJ. When viewed in a plan view, the plurality of conductive lines 160 may be arranged in a second direction D2 intersecting the first direction D1.

Figure 11:
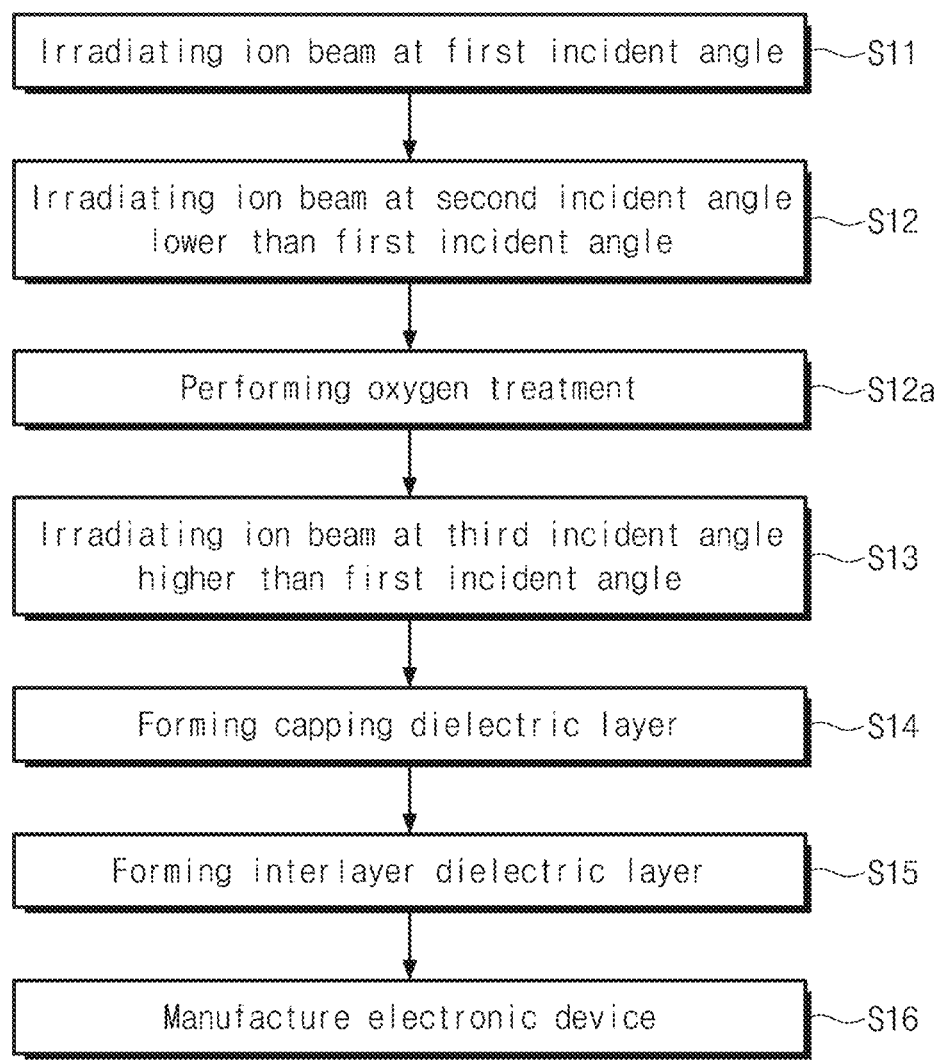
FIG. 11 is a process flow chart illustrating a method for manufacturing a data storage device according to some example embodiments of the inventive concepts.
Figure 12:
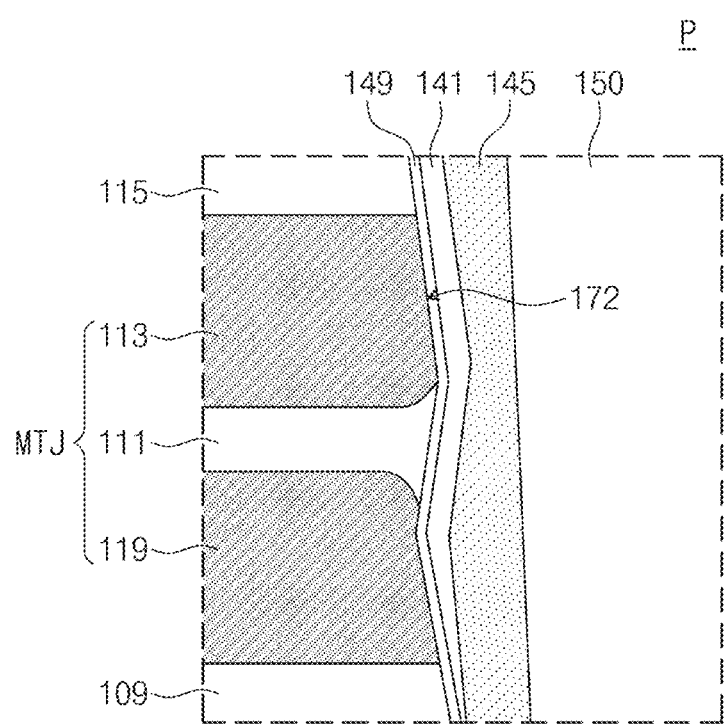
FIG. 12 is an enlarged view of a data storage device formed according to the process flow chart of FIG. 11.

FIG. 11 is a process flow chart illustrating a method for manufacturing a data storage device according to some example embodiments of the inventive concepts. FIG. 12 is an enlarged view of a data storage device formed according to the process flow chart of FIG. 11. The same description of the overlapping parts will be omitted for the sake of simplicity.

The process flow chart in FIG. 11 may be substantially the same as the process flow chart in FIG. 2 except for an oxygen treatment process S12a performed between the second step S12 and the third step S13. The oxygen treatment S12a may be performed by supplying oxygen ions or oxygen molecules into the chamber assembly 200 of FIG. 1. For example, the oxygen ions may be supplied into the process chamber 204 of FIG. 1 in the form of an ion beam. After completion of the first and second steps S11 and S12, conductive materials remaining on the sidewalls of the magnetic tunnel junction pattern MTJ may be oxidized by the oxygen treatment process S12a. Thus, as shown in FIG. 12, an inner insulating pattern 149 may be formed on the sidewalls 172 of the magnetic tunnel junction pattern MTJ before the sidewall insulating pattern 141 is formed by the oxygen treatment process S12a. The inner insulating pattern 149 may include metal oxide or metal oxynitride. The inner insulating pattern 149 may have a thinner thickness than the thickness of the sidewall insulating pattern 141.

Figure 15:
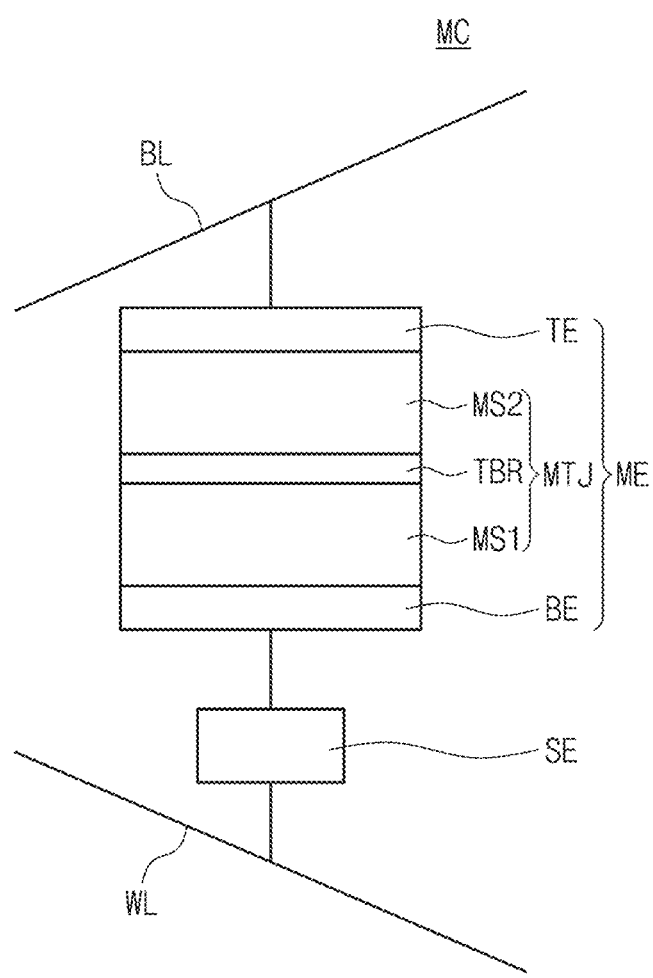
FIG. 15 is a circuit diagram illustrating a unit memory cell of a data storage device according to some example embodiments of the inventive concepts.

FIG. 15 is a circuit diagram illustrating a unit memory cell of a data storage device according to some example embodiments of the inventive concepts.

Referring to FIG. 15, the data storage device to some example embodiments of the inventive concepts may be a magnetic memory device. The unit memory cell MC may include a memory element ME and a select element SE. The memory element ME may be provided between a bit line BL and a word line WL, and the select element SE may be provided between the memory element ME and the word line WL. The memory element ME may be a variable resistance device whose resistance can be switched to one of two states by an electric pulse applied thereto. In some example embodiments, the memory element ME may be formed to have a layered structure whose electric resistance can be changed by a spin transfer process using an electric current passing therethrough. For example, the memory element ME may have a layered structure configured to exhibit a magnetoresistance property, and may include at least one ferromagnetic material and/or at least one antiferromagnetic material. The select element SE may be configured to selectively control a flow of electric charge passing through the memory element ME. For example, the select element SE may be one of a diode, a p-n-p bipolar transistor, an n-p-n bipolar transistor, an n-channel metal-oxide-semiconductor field effect transistor (NMOSFET) and a p-channel metal-oxide-semiconductor field effect transistor (PMOSFET). When the select element SE is a three terminal switching device, such as a bipolar transistor or a MOSFET, an additional interconnection line may be connected to the select element SE.

The memory element ME may include a first magnetic structure MS1, a second magnetic structure MS2 and a tunnel barrier TBR interposed therebetween. The first magnetic structure MS1, the second magnetic structure MS2 and the tunnel barrier TBR may constitute a magnetic tunnel junction pattern MTJ. The first and second magnetic structures MS1 and MS2 may respectively include at least one magnetic layer that is formed of a magnetic material. The memory element ME may further include a bottom electrode BE and a top electrode. The bottom electrode may be interposed between the second magnetic structure MS2 and the select element SE. The top electrode TE may be interposed between the first magnetic structure MS1 and the bit line BL.

FIG. 16 is a diagram illustrating an electronic device 1600 according to some example embodiments.

Referring to FIG. 16, the electronic device 1600 includes a memory 1620, a processor 1630, and a communication interface 1640.

The electronic device 1600 may be included in one or more various electronic devices. In some example embodiments, the electronic device 1600 may include a computing device. A computing device may include a personal computer (PC), a tablet computer, a laptop computer, a netbook, some combination thereof, or the like. The memory 1620, the processor 1630, and the communication interface 1640 may communicate with one another through a bus 1610.

In some example embodiments, the memory 1620 may include one or more of the data storage devices that may be manufactured according to any of the methods as described herein.

The communication interface 1640 may communicate data from an external device using various Internet protocols. The external device may include, for example, a computing device.

The processor 1630 may execute a program and control the electronic device 1600. A program code to be executed by the processor 1630 may be stored in the memory 1620. An electronic system may be connected to an external device through an input/output device (not shown) and exchange data with the external device.

The memory 1620 may store information. The memory 1620 may be a volatile or a nonvolatile memory. The memory may be a magnetic memory device (e.g., an MRAM). The memory 1620 may be a non-transitory computer readable storage medium. The memory may store computer-readable instructions that, when executed, cause the execution of one or more methods, functions, processes, etc. as described herein. In some example embodiments, the processor 1630 may execute one or more of the computer-readable instructions stored at the memory 1620.

In some example embodiments, the communication interface 1640 may include a USB and/or HDMI interface. In some example embodiments, the communication interface 1850 may include a wireless communication interface.

In some example embodiments, the electronic device 1600 may at least partially comprise the controller 402 illustrated and described with reference to FIG. 1. As such, the electronic device 1600, in some example embodiments, may be configured to perform any of the manufacturing methods that may be controlled by the controller 402.

While the inventive concepts have been described with reference to some example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
a substrate;
an insulating layer disposed on the substrate;
a contact plug disposed in the insulating layer;
a first magnetic pattern disposed on the contact plug;
a tunnel barrier pattern disposed on the first magnetic pattern; and
a second magnetic pattern disposed on the tunnel barrier pattern,
wherein a width of a bottom portion of the first magnetic pattern is greater than a width of a bottom portion of the second magnetic pattern,
a thickness of an edge portion of the tunnel barrier pattern is greater than a thickness of a center portion of the tunnel barrier pattern,
an edge part of a bottom surface of the tunnel barrier pattern is disposed lower than a center part of the bottom surface of the tunnel barrier pattern, and
an outermost side wall of the tunnel barrier pattern is sloped.

2. The semiconductor device of claim 1, wherein an edge part of a top surface of the tunnel barrier pattern is disposed higher than a center part of the top surface of the tunnel barrier pattern.

3. The semiconductor device of claim 1, wherein a thickness of an edge portion of the first magnetic pattern is less than a thickness of a center portion of the first magnetic pattern.

4. The semiconductor device of claim 1, wherein a thickness of an edge portion of the second magnetic pattern is less than a thickness of a center portion of the second magnetic pattern.

5. The semiconductor device of claim 1, wherein the width of the bottom portion of the first magnetic pattern is greater than a width of a top portion of the first magnetic pattern.

6. The semiconductor device of claim 1, wherein a width of a bottom portion of the tunnel barrier pattern is greater than a width of a top portion of the tunnel barrier pattern.

7. The semiconductor device of claim 1, wherein the width of the bottom portion of the second magnetic pattern is greater than a width of a top portion of the second magnetic pattern.

8. A semiconductor device comprising:
a substrate;
an insulating layer disposed on the substrate;
a contact plug disposed in the insulating layer;
a first magnetic pattern disposed on the contact plug;

a tunnel barrier pattern disposed on the first magnetic pattern; and a second magnetic pattern disposed on the tunnel barrier pattern, wherein a thickness of an edge portion of the tunnel barrier pattern is greater than a thickness of a center portion of the tunnel barrier pattern, an edge part of a top surface of the tunnel barrier pattern is disposed higher than a center part of the top surface of the tunnel barrier pattern, an edge part of a bottom surface of the tunnel barrier pattern is disposed lower than a center part of the bottom surface of the tunnel barrier pattern, the first magnetic pattern, the tunnel barrier pattern and the second magnetic pattern form a magnetic tunnel junction pattern, and an outermost side wall of the tunnel barrier pattern is sloped.

9. The semiconductor device of claim 8, wherein a width of a bottom portion of the first magnetic pattern is greater than a width of a top portion of the second magnetic pattern.

10. The semiconductor device of claim 8, wherein a width of a bottom portion of the magnetic tunnel junction pattern is greater than a width of a top portion of the magnetic tunnel junction pattern.

11. The semiconductor device of claim 8, wherein the top surface of the tunnel barrier pattern is not flat.

12. The semiconductor device of claim 8, wherein the bottom surface of the tunnel barrier pattern is not flat.

13. The semiconductor device of claim 8, wherein the tunnel barrier pattern includes magnesium oxide (MgO), titanium oxide (TiO), aluminum oxide (AlO), magnesium zinc oxide (MgZnO) or magnesium boron oxide (MgBO).

14. A semiconductor device comprising:
a substrate;
a contact plug disposed on the substrate;
a first conductive pattern disposed on the contact plug;
a first magnetic pattern disposed on the first conductive pattern;
a tunnel barrier pattern disposed on the first magnetic pattern;
a second magnetic pattern disposed on the tunnel barrier pattern; and
a second conductive pattern disposed on the second magnetic pattern, wherein a width of a bottom portion of the first magnetic pattern is greater than a width of a bottom portion of the second magnetic pattern, a thickness of an edge portion of the tunnel barrier pattern is greater than a thickness of a center portion of the tunnel barrier pattern, an edge part of a bottom surface of the tunnel barrier pattern is disposed lower than a center part of the bottom surface of the tunnel barrier pattern, an edge part of a top surface of the tunnel barrier pattern is disposed higher than a center part of the top surface of the tunnel barrier pattern, an outermost side wall of the tunnel barrier pattern is sloped.

15. The semiconductor device of claim 14, wherein the first magnetic pattern, the tunnel barrier pattern and the second magnetic pattern form a magnetic tunnel junction pattern.

16. The semiconductor device of claim 15, wherein a width of a bottom portion of the magnetic tunnel junction pattern is greater than a width of a top portion of the magnetic tunnel junction pattern.

17. The semiconductor device of claim 14, wherein the top surface of the tunnel barrier pattern is not flat, and the bottom surface of the tunnel barrier pattern is not flat.

18. The semiconductor device of claim 14, wherein the contact plug includes tungsten, titanium, tantalum, titanium nitride, tantalum nitride or tungsten nitride.

19. The semiconductor device of claim 14, wherein the semiconductor device is a magnetic random access memory (MRAM) device.

* * * * *